United States Patent
Koge et al.

(10) Patent No.: US 11,366,394 B2
(45) Date of Patent: Jun. 21, 2022

(54) EXTREME ULTRAVIOLET LIGHT GENERATION SYSTEM AND ELECTRONIC DEVICE MANUFACTURING METHOD

(71) Applicant: Gigaphoton Inc., Tochigi (JP)

(72) Inventors: Koichiro Koge, Oyama (JP); Atsushi Ueda, Oyama (JP); Takayuki Osanai, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/492,280

(22) Filed: Oct. 1, 2021

(65) Prior Publication Data
US 2022/0146943 A1    May 12, 2022

(30) Foreign Application Priority Data

Nov. 12, 2020 (JP) .............................. JP2020-188485

(51) Int. Cl.
*G03F 7/20* (2006.01)
*G21K 1/06* (2006.01)
*H05G 2/00* (2006.01)
*H01S 3/16* (2006.01)
*H01S 3/223* (2006.01)

(52) U.S. Cl.
CPC ...... *G03F 7/70033* (2013.01); *G03F 7/70025* (2013.01); *G03F 7/70041* (2013.01); *G03F 7/70608* (2013.01); *G21K 1/06* (2013.01); *H05G 2/006* (2013.01); *H05G 2/008* (2013.01); *H01S 3/1643* (2013.01); *H01S 3/2232* (2013.01)

(58) Field of Classification Search
None
See application file for complete search history.

(56) References Cited

U.S. PATENT DOCUMENTS

| 2009/0057567 A1 | 3/2009 | Bykanov et al. |
| 2015/0008335 A1 | 1/2015 | Bykanov et al. |

*Primary Examiner* — Michelle M Iacoletti
(74) *Attorney, Agent, or Firm* — Studebaker & Brackett PC

(57) ABSTRACT

An extreme ultraviolet light generation system may include a chamber, a first partition wall having at least one opening which provides communication between a first space and a second space, an EUV light concentrating mirror located in the second space and configured to concentrate extreme ultraviolet light generated in a plasma generation region located in the first space, a first gas supply port formed at the chamber, and a gas exhaust port formed in the first partition wall, a distance between the center of the plasma generation region and an edge of the at least one opening being equal to or more than a stop distance $L_{STOP}$ [mm] calculated by the following equation:

$$L_{STOP} = 272.8 \cdot E_{AVG}^{0.4522} \cdot P^{-1}$$

$E_{AVG}$ [eV] representing average kinetic energy of ions generated in the plasma generation region and P [Pa] representing a gas pressure inside the first partition wall.

20 Claims, 10 Drawing Sheets

EXTREME ULTRAVIOLET LIGHT GENERATION SYSTEM AND ELECTRONIC DEVICE MANUFACTURING METHOD

CROSS-REFERENCE TO RELATED APPLICATIONS

The present application claims the benefit of Japanese Patent Application No. 2020-188485, filed on Nov. 12, 2020, the entire contents of which are hereby incorporated by reference.

BACKGROUND

1. Technical Field

The present disclosure relates to an extreme ultraviolet light generation system and an electronic device manufacturing method.

2. Related Art

Recently, miniaturization of a transfer pattern in optical lithography of a semiconductor process has been rapidly proceeding along with miniaturization of the semiconductor process. In the next generation, fine processing at 70 to 45 nm and further at 32 nm or less will be required. Therefore, in order to meet the demand for fine processing of, for example, 32 nm or less, the development of an exposure apparatus that combines an extreme ultraviolet (EUV) light generation apparatus that generates EUV light having a wavelength of about 13 nm and reduced projection reflection optics is expected.

As an EUV light generation apparatus, three types of apparatuses have been proposed: a laser produced plasma (LPP) type apparatus using plasma generated by irradiating a target substance with pulse laser light, a discharge produced plasma (DPP) type apparatus using plasma generated by discharge, and a synchrotron radiation (SR) type apparatus using synchrotron radiation.

LIST OF DOCUMENTS

Patent Documents

Patent Document 1: US Patent Application Publication No. 2015/0008335
Patent Document 2: US Patent Application Publication No. 2009/0057567

SUMMARY

An extreme ultraviolet light generation system according to an aspect of the present disclosure includes a chamber, a first partition wall having at least one opening which provides communication between a first space in the chamber and inside the first partition wall and a second space in the chamber and outside the first partition wall, an EUV light concentrating mirror located in the second space and configured to concentrate extreme ultraviolet light generated in a plasma generation region located in the first space, a first gas supply port formed at the chamber and configured to supply gas to the second space, and a gas exhaust port formed in the first partition wall and configured to exhaust gas in the first space to outside the first partition wall and outside the chamber. Here, a distance between the center of the plasma generation region and an edge of the at least one opening is equal to or more than a stop distance $L_{STOP}$ [mm] calculated by the following equation.

$$L_{STOP}=272.8 \cdot E_{AVG}^{0.4522} \cdot P^{-1}$$

$E_{AVG}$ [eV] representing average kinetic energy of ions generated in the plasma generation region and P [Pa] representing a gas pressure inside the first partition wall An electronic device manufacturing method according to an aspect of the present disclosure includes generating extreme ultraviolet light in an extreme ultraviolet light generation system, emitting the extreme ultraviolet light to an exposure apparatus, and exposing a photosensitive substrate to the extreme ultraviolet light in the exposure apparatus to manufacture an electronic device. Here, the extreme ultraviolet light generation system includes a chamber, a first partition wall having at least one opening which provides communication between a first space in the chamber and inside the first partition wall and a second space in the chamber and outside the first partition wall, an EUV light concentrating mirror located in the second space and configured to concentrate the extreme ultraviolet light generated in a plasma generation region located in the first space, a first gas supply port formed at the chamber and configured to supply gas to the second space, and a gas exhaust port formed in the first partition wall and configured to exhaust gas in the first space to a space outside the first partition wall and outside the chamber. Here, a distance between the center of the plasma generation region and an edge of the at least one opening is equal to or more than a stop distance $L_{STOP}$ [mm] calculated by the following equation.

$$L_{STOP}=272.8 \cdot E_{AVG}^{0.4522} \cdot P^{-1}$$

$E_{AVG}$ [eV] representing average kinetic energy of ions generated in the plasma generation region and P [Pa] representing a gas pressure inside the first partition wall An electronic device manufacturing method according to an aspect of the present disclosure includes inspecting a defect of a mask by irradiating the mask with extreme ultraviolet light generated by an extreme ultraviolet light generation system, selecting a mask using a result of the inspection, and exposing and transferring a pattern formed on the selected mask onto a photosensitive substrate. Here, the extreme ultraviolet light generation system includes a chamber, a first partition wall having at least one opening which provides communication between a first space in the chamber and inside the first partition wall and a second space in the chamber and outside the first partition wall, an EUV light concentrating mirror located in the second space and configured to concentrate the extreme ultraviolet light generated in a plasma generation region located in the first space, a first gas supply port formed in the chamber and configured to supply gas to the second space, and a gas exhaust port formed in the first partition wall and configured to exhaust gas in the first space to a space outside the first partition wall and outside the chamber.

Here, a distance between the center of the plasma generation region and an edge of the at least one opening being equal to or more than a stop distance $L_{STOP}$ [mm] calculated by the following equation.

$$L_{STOP}=272.8 \cdot E_{AVG}^{0.4522} \cdot P^{-1}$$

$E_{AVG}$ [eV] representing average kinetic energy of ions generated in the plasma generation region and P [Pa] representing a gas pressure inside the first partition wall

BRIEF DESCRIPTION OF THE DRAWINGS

Embodiments of the present disclosure will be described below merely as examples with reference to the accompanying drawings.

DESCRIPTION OF EMBODIMENTS

Figure 1:
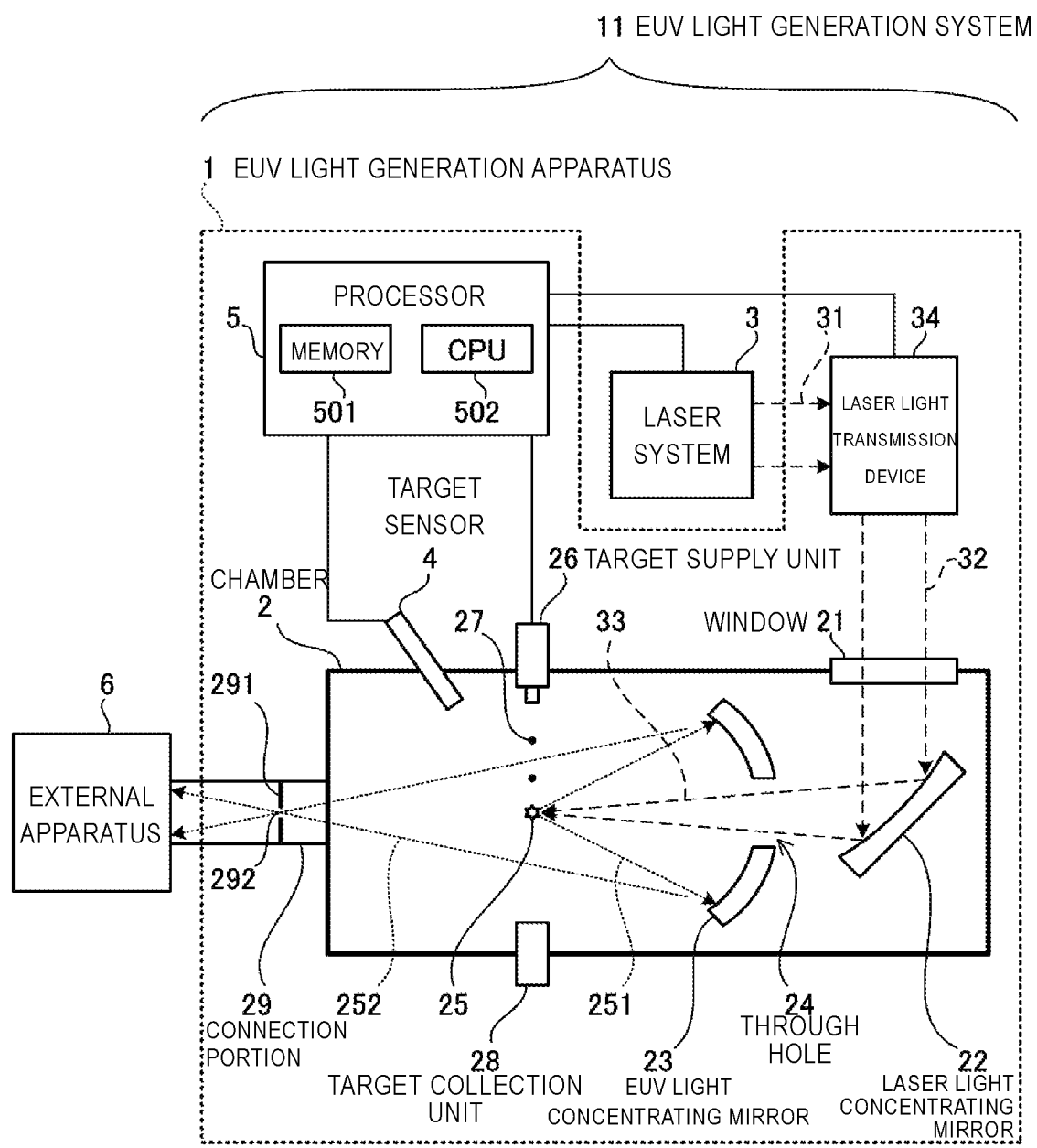
FIG. 1 schematically shows an exemplary configuration of an LPP EUV light generation system.

<Contents>
1. Overall description of EUV light generation system 11
  1.1 Configuration
  1.2 Operation
2. EUV light generation apparatus 1a according to comparative example
  2.1 Configuration
  2.2 Operation
  2.3 Problem
3. EUV light generation apparatus 1b having first partition wall 37 arranged in chamber 2b
  3.1 Configuration
  3.2 Operation
  3.3 Distance between plasma generation region 25 and first to seventh openings 371 to 377
  3.4 Effect
4. EUV light generation system 11 including infrared laser
  4.1 Configuration and operation
  4.2 In a case of $CO_2$ laser
  4.3 In a case of YAG laser
  4.4 Effect
5. EUV light generation apparatus 1d including second partition wall 2d
  5.1 Configuration
  5.2 Operation
  5.3 Effect
6. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 11

1.1 Configuration

FIG. 1 schematically illustrates an exemplary configuration of an LPP EUV light generation system 11. An EUV light generation apparatus 1 is used together with a laser system 3. In the present disclosure, a system including the EUV light generation apparatus 1 and the laser system 3 is referred to as the EUV light generation system 11. The EUV light generation apparatus 1 includes a chamber 2 and a target supply unit 26. The chamber 2 is a sealable container. The target supply unit 26 supplies a target substance into the chamber 2. The material of the target substance includes, for example, tin.

A through hole is formed in a wall of the chamber 2. The through hole is blocked by a window 21 through which pulse laser light 32 emitted from the laser system 3 passes. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The EUV light generation apparatus 1 includes a processor 5, a target sensor 4, and the like. The processor 5 is a processing device including a memory 501 in which a control program is stored, and a central processing unit (CPU) 502 for executing the control program. The processor 5 is specifically configured or programmed to perform various processes included in the present disclosure. The target sensor 4 detects at least one of the presence, trajectory, position, and velocity of a target 27. The target sensor 4 may have an imaging function.

Further, the EUV light generation apparatus 1 includes a connection portion 29 providing communication between the inside of the chamber 2 and the inside of an external apparatus 6. A wall 291 in which an aperture is formed is arranged in the connection portion 29. The wall 291 is arranged such that the aperture is located at the second focal point of the EUV light concentrating mirror 23.

Furthermore, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element.

1.2 Operation

Operation of the EUV light generation system 11 will be described with reference to FIG. 1. Pulse laser light 31 emitted from the laser system 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as the pulse laser light 33.

The target supply unit 26 supplies the target 27 containing the target substance to the plasma generation region 25 in the chamber 2. The target 27 is irradiated with the pulse laser light 33. The target 27 irradiated with the pulse laser light 33 is turned into plasma, and radiation light 251 is radiated from the plasma. EUV light contained in the radiation light 251 is reflected by the EUV light concentrating mirror 23 with higher reflectance than light in other wavelength ranges. Reflection light 252 including the EUV light reflected by the EUV light concentrating mirror 23 is concentrated on the intermediate focal point 292 and output to the external apparatus 6. Here, one target 27 may be irradiated with a plurality of pulses included in the pulse laser light 33.

The processor 5 controls the entire EUV light generation system 11. The processor 5 processes a detection result of the target sensor 4. Based on the detection result of the target sensor 4, the processor 5 controls the timing at which the target 27 is output, the output direction of the target 27, and the like. Furthermore, the processor 5 controls the oscillation timing of the laser system 3, the travel direction of the pulse laser light 32, the concentrating position of the pulse laser light 33, and the like. Such various kinds of control described above are merely exemplary, and other control may be added as necessary.

Figure 2:
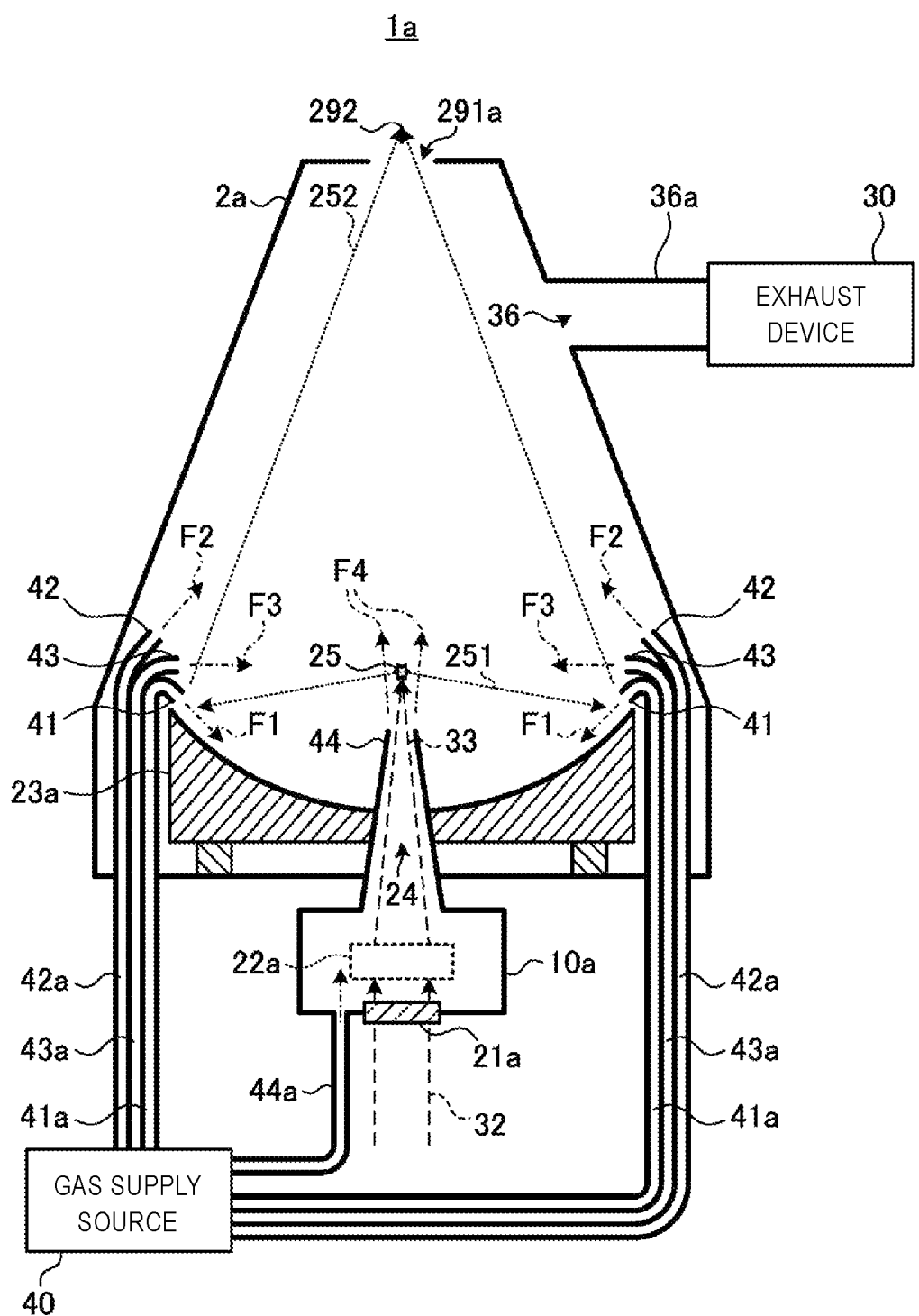
FIG. 2 schematically shows the configuration of an EUV light generation apparatus according to a comparative example.

2. EUV Light Generation Apparatus 1a According to Comparative Example 2.1 Configuration FIG. 2 schematically shows the configuration of an EUV light generation apparatus 1a according to a comparative example. The EUV light generation apparatus 1a includes a chamber 2a, a sub-chamber 10a, an EUV light concentrating mirror 23a, an exhaust device 30, and a gas supply source 40.

The chamber 2a has a substantially conical shape. An aperture 291a is formed at an end part of the chamber 2a on a small diameter side. The EUV light concentrating mirror 23a is fixed to an end part of the chamber 2a on a large diameter side.

The gas supply source 40 is connected to the sub-chamber 10a through a pipe 44a. A window 21a for transmitting the pulse laser light 32 is arranged at the sub-chamber 10a. Further, a laser light concentrating optical system 22a is arranged in the sub-chamber 10a. The sub-chamber 10a is connected to a cylindrical laser light path wall 44. The laser light path wall 44 penetrates the through hole 24 of the EUV light concentrating mirror 23a and a through hole at the end part of the large diameter side of the chamber 2a. The pulse laser light 33 having passed through the laser light concentrating optical system 22a can pass through the inside of the laser light path wall 44.

The gas supply source 40 is further connected to first to third nozzles 41 to 43 in the chamber 2a through pipes 41a to 43a. The first to third nozzles 41 to 43 are arranged on the outer peripheral portion of the EUV light concentrating mirror 23a.

The gas supply source 40 includes a gas cylinder (not shown). The gas supplied by the gas supply source 40 to the sub-chamber 10a and the chamber 2a includes etching gas. The etching gas includes hydrogen gas.

The exhaust device 30 is connected to an exhaust pipe 36a. The exhaust pipe 36a is connected to the inside of the chamber 2a through an exhaust port 36 formed at the chamber 2a. The exhaust pipe 36a may further be connected to a particulate trap or a detoxification device (not shown).

2.2 Operation

The target 27 supplied to the plasma generation region 25 (see FIG. 1) is irradiated with the pulse laser light 33 having passed through the inside of the laser light path wall 44. When the target 27 is irradiated with the pulse laser light 33, the target substance is turned into plasma, and radiation light 251 is radiated from the plasma. The plasma includes ions of the target substance. The ions of the target substance diffuse in the chamber 2a.

The gas supply source 40 supplies gas into the sub-chamber 10a. Owing to the gas supplied into the sub-chamber 10a, the pressure in the sub-chamber 10a becomes higher than the pressure in the chamber 2a. The gas supplied into the sub-chamber 10a flows out toward the plasma generation region 25 and the vicinity thereof through the inside of the laser light path wall 44. The flow of gas flowing out of the laser light path wall 44 is indicated by arrow F4.

By making the pressure in the sub-chamber 10a higher than the pressure in the chamber 2a, it is possible to suppress the ions of the target substance from entering the sub-chamber 10a. Even if the ions of the target substance enter the sub-chamber 10a, owing to that the gas supply source 40 supplies etching gas to the sub-chamber 10a, it is possible to suppress debris of the target substance from being deposited on the laser light concentrating optical system 22a.

The gas supply source 40 also supplies gas to the first to third nozzles 41 to 43 in the chamber 2a. The gas supplied to the first to third nozzles 41 to 43 flows in the directions of arrows F1 to F3, respectively.

By contriving the directions and flow rates of the gas flowing out of the first to third nozzles 41 to 43 and the gas flowing out of the laser light path wall 44, it is possible to suppress ions of the target substance from reaching the EUV light concentrating mirror 23a. Even if ions of the target substance reach the EUV light concentrating mirror 23a, owing to that the gas supply source 40 supplies etching gas to the first nozzle 41, it is possible to suppress debris of the target substance from being deposited on the EUV light concentrating mirror 23a.

The exhaust device 30 exhausts the inside of the chamber 2a to a predetermined pressure lower than the atmospheric pressure. Along with the gas exhaust, ions of the target substance are also discharged to the outside of the chamber 2a.

2.3 Problem

In the comparative example, by controlling the gas flow, deposition of debris of the target substance on the EUV light concentrating mirror 23a is suppressed. However, if there is a region where the gas flow is stagnant, debris of the target substance may be deposited in the vicinity thereof. To suppress the deposition of debris, it is necessary to control the gas flow at a high level for suppressing the gas stagnation, and the gas nozzle is required to have a complicated structure and the flow rate is required to be controlled with high accuracy.

In some embodiments described below, a first partition wall 37 is arranged in a chamber 2b that partitions a first space 20a in which the plasma generation region 25 is located and a second space 20b in which an EUV light concentrating mirror 23b is located. The first partition wall 37 has at least one opening. The dimensions of respective parts of an EUV light generation apparatus 1b are determined so that the distance between the center of the plasma generation region 25 and the edge of the at least one opening is equal to or larger than a stop distance $L_{STOP}$ determined by average movement energy $E_{AVG}$ of ions and a gas pressure P inside the first partition wall 37. Thus, debris of the target substance is suppressed from jumping out from the first space 20a to the second space 20b. The edge of the opening refers to a boundary defining the position and shape of the opening in the first partition wall 37.

Figure 3:
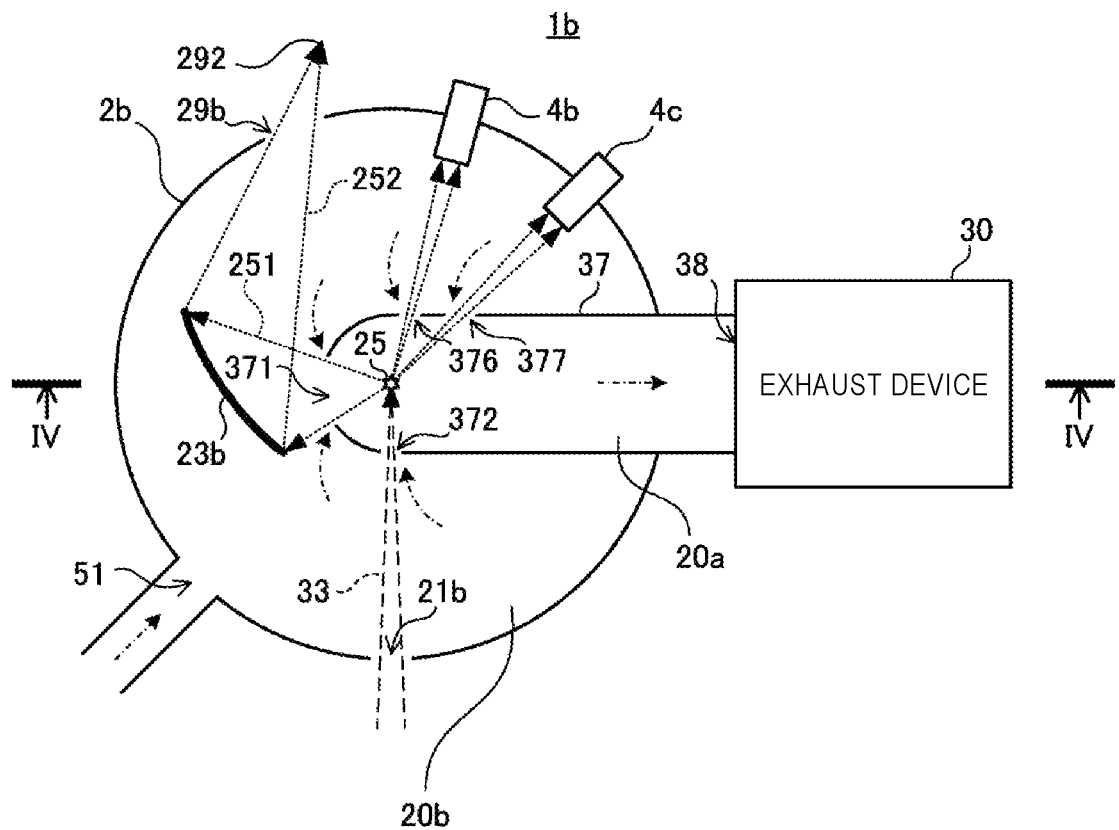
FIG. 3 is a sectional view showing the configuration of the EUV light generation apparatus according to a first embodiment.
Figure 4:
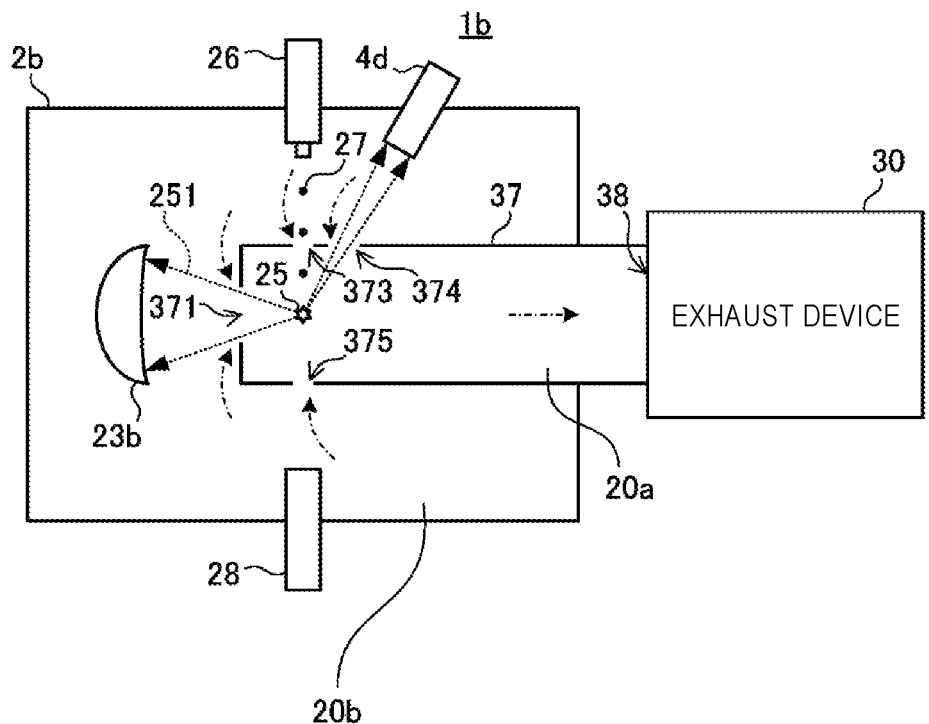
FIG. 4 is a sectional view showing the configuration of the EUV light generation apparatus according to the first embodiment.

3. EUV Light Generation Apparatus 1b Having First Partition Wall 37 Arranged in Chamber 2b 3.1 Configuration FIGS. 3 and 4 are sectional views showing the configuration of the EUV light generation apparatus 1b according to a first embodiment. FIG. 3 shows a cross-section perpendicular to the trajectory of the target 27, and FIG. 4 shows a cross-section perpendicular to the optical path axis of the pulse laser light 33. FIG. 4 corresponds to a sectional view taken along line IV-IV of FIG. 3, and since the line IV-IV is located substantially at the center of the EUV light concentrating mirror 23b, the EUV light concentrating mirror 23b is shown in a substantially semi-elliptical shape in FIG. 4.

The EUV light generation apparatus 1b includes the chamber 2b, the EUV light concentrating mirror 23b, the first partition wall 37, a first gas supply port 51, and a gas exhaust port 38.

The chamber 2b has a substantially cylindrical shape. The target supply unit 26 and the target collection unit 28 are arranged at positions on the center axis of the cylindrical shape outside the first partition wall 37. The plasma generation region 25 is located at a position between the target supply unit 26 and the target collection unit 28 in the first partition wall 37.

A window 21b for transmitting the pulse laser light 33 is arranged at the chamber 2b. The window 21b may be an opening.

Sensors 4b, 4c, and 4d are attached to the chamber 2b. The sensors 4b, 4c, and 4d may include, for example, a target sensor for detecting at least one of the presence, trajectory, position, and velocity of the target 27, or may include a sensor for detecting an emission point of the EUV light. Although not shown, each of the sensors 4b, 4c, and 4d may include an image sensor or an optical sensor, and an optical system that forms an image at the plasma generation region 25 inside the first partition wall 37 or the vicinity thereof on the image sensor or the optical sensor. Instead of the sensor, a light source that illuminates the plasma generation region 25 with visible light may be arranged at any one position of the sensors 4b, 4c, and 4d.

The first partition wall 37 is made of stainless steel or metal molybdenum. The first partition wall 37 has a cylindrical shape, and the first partition wall 37 penetrates the side surface of the chamber 2b.

A part of the first partition wall 37 is located in the chamber 2b and is arranged so as to cover the plasma generation region 25. In the chamber 2b, the first partition wall 37 has at least one opening. The at least one opening includes one or more of the first to seventh openings 371 to 377. The first to seventh openings 371 to 377 provide communication between the first space 20a in the chamber 2b and inside the first partition wall 37 and the second space 20b in the chamber 2b and outside the first partition wall 37. The first to seventh openings 371 to 377 correspond to the plurality of openings in the present disclosure. The other part of the first partition wall 37 is located outside the chamber 2b and is connected to the exhaust device 30. The gas exhaust port 38 is located between the first partition wall 37 and the exhaust device 30. The gas exhaust port 38 is not included in any of the at least one opening and the plurality of openings in the present disclosure. The gas supply source 40 (see FIG. 2) is connected to the first gas supply port 51.

The EUV light concentrating mirror 23b has a spheroidal reflection surface. The EUV light concentrating mirror 23b is located in the second space 20b in the chamber 2b and outside the first partition wall 37. The EUV light concentrating mirror 23b has a first focal point located in the plasma generation region 25 and a second focal point located at the intermediate focal point 292. The first opening 371 is located on the optical path of the radiation light 251 including the EUV light generated at the plasma generation region 25 and directed toward the EUV light concentrating mirror 23b. An opening 29b of the chamber 2b is located at the optical path of the reflection light 252 directed toward the intermediate focal point 292 from the EUV light concentrating mirror 23b. The EUV light concentrating mirror 23b is arranged such that the center axis of the optical path of the reflection light 252 is inclined with respect to the center axis of the optical path of the radiation light 251.

The fourth, sixth, and seventh openings 374, 376, and 377 are located between the plasma generation region 25 and the sensors 4b, 4c, and 4d, respectively. Accordingly, light emitted from the plasma generation region 25 or the vicinity thereof reaches the sensors 4b, 4c, and 4d. Alternatively, light emitted from a light source located at any one of the positions of the sensors 4b, 4c, and 4d reaches the plasma generation region 25. Thus, the fourth, sixth, and seventh openings 374, 376, and 377 allow light for observing a part of the first space 20a to pass therethrough.

3.2 Operation

The target 27 output from the target supply unit 26 passes through the third opening 373 and reaches the plasma generation region 25. Among the plurality of targets 27, the targets 27 without being irradiated with the pulse laser light 33 and without being turned into plasma pass through the plasma generation region 25, further pass through the fifth opening 375, and reach the target collection unit 28.

The pulse laser light 33 passes through the second opening 372, enters to the inside of the first partition wall 37, and causes the target 27 to be turned into plasma by being radiated to the target 27 at the plasma generation region 25.

The radiation light 251 including the EUV light generated at the plasma generation region 25 passes through the first opening 371 and is incident on the EUV light concentrating mirror 23b. The EUV light concentrating mirror 23b concentrates the EUV light on the intermediate focal point 292 by reflecting the EUV light.

The first opening 371 is located outside the optical path of the reflection light 252 including the EUV light reflected by the EUV light concentrating mirror 23b. Therefore, it is possible to suppress some of the reflection light 252 from entering the first opening 371 and being wasted. Furthermore, the first partition wall 37 is located outside the optical path of the reflection light 252. Therefore, it is possible to suppress some of the reflection light 252 from entering the first partition wall 37 and being wasted.

The gas supply source 40 (see FIG. 2) supplies gas to the second space 20b in the chamber 2b and outside the first partition wall 37 through the first gas supply port 51. The flow rate of the gas at the first gas supply port 51 is, for example, not less than 40 nlm and not more than 60 nlm. Here, "nlm" represents the volume of the gas flowing per minute converted to that at 0° C. and 1 atm.

The exhaust device 30 exhausts the gas in the first space 20a inside the first partition wall 37 to the space outside the chamber 2b and outside the first partition wall 37 through the gas exhaust port 38. As a result, the pressure in the first space 20a is maintained lower than the pressure in the second space 20b. As a result, through the first to seventh openings 371 to 377, the gas flows from the second space 20b to the first space 20a as indicated by the dashed-dotted arrows.

Therefore, ions of the target substance are suppressed from moving from the first space 20a to the second space 20b, and debris of the target substance is suppressed from being deposited on the EUV light concentrating mirror 23b.

However, when ions of the target substance have high kinetic energy, the ions may jump out from the first space 20a to the second space 20b against the gas flow. It is desirable that the kinetic energy of the ions decreases by the time the ions reach the at least one opening of the first partition wall 37.

3.3 Distance Between Plasma Generation Region 25 and First to Seventh Openings 371 to 377

The kinetic energy of the ions of the target substance gradually decreases by repeating collisions with gas particles in the first partition wall 37. If the kinetic energy of the ions decreases to the same extent as the kinetic energy of the gas particles around the ions by the time the ions reach the at least one opening of the first partition wall 37, the ions are suppressed from jumping out to the second space 20b.

Here, the target substance is tin, and the gas particles are hydrogen molecules. The kinetic energy of the gas particles in the first partition wall 37 is 0.03 eV.

The distance from the center of the plasma generation region 25 to the position where the kinetic energy of tin ions decreases to 0.03 eV is represented by a stop distance $L_{STOP}$. The stop distance $L_{STOP}$ can be expressed by following Equation 1.

$$L_{STOP} = A \cdot P^{-1} \cdot T \quad \text{Equation 1}$$

Here, A represents a constant determined by combinations of gas species and ion species and kinetic energy of ions, and the unit is Pa·mm/K. P represents the gas pressure inside the first partition wall 37, and the unit is Pa. T represents the temperature of the gas in the first partition wall 37, and the unit is K.

Figure 5:
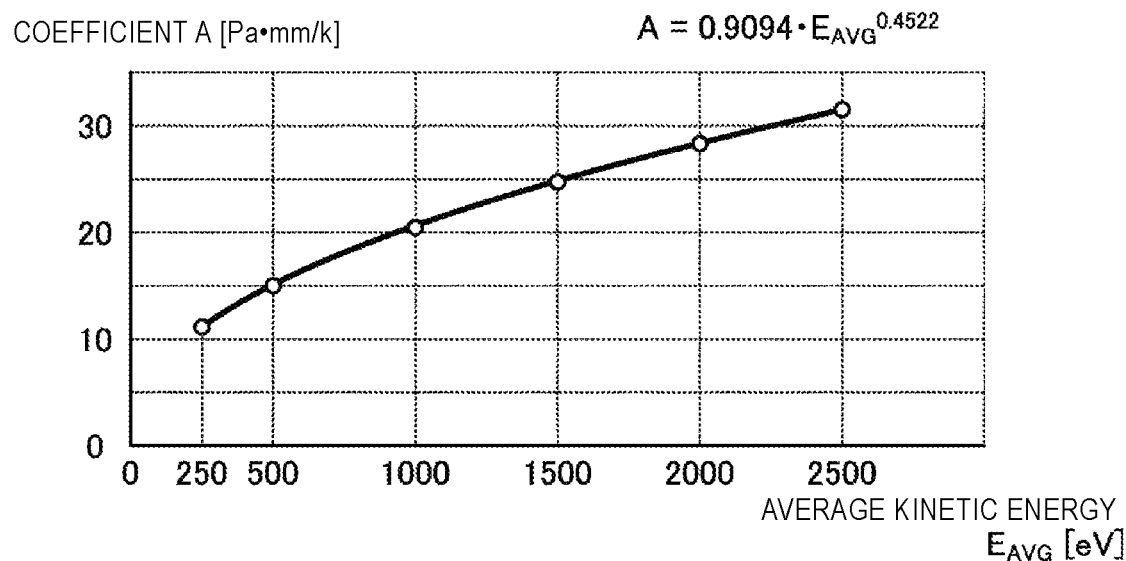
FIG. 5 is a graph showing the relationship, calculated by simulation, between average kinetic energy of tin ions generated in a plasma generation region and a coefficient A.

FIG. 5 is a graph showing the relationship, calculated by simulation, between average kinetic energy $E_{AVG}$ of tin ions generated in the plasma generation region 25 and the coefficient A. Here, the average kinetic energy $E_{AVG}$ is set to be not less than 250 eV and not more than 2500 eV. The kinetic energy of tin ions is assumed to have a distribution concentrated in the vicinity of the average kinetic energy $E_{AVG}$, and tin ions having kinetic energy twice the average kinetic energy $E_{AVG}$ or less are considered.

An approximate equation obtained from the result of the simulation shown in FIG. 5 is as following Equation 2.

$$A = 0.9094 \cdot E_{AVG}^{0.4522} \quad \text{Equation 2}$$

From Equation 1 and Equation 2, the stop distance $L_{STOP}$ can be expressed by following Equation 3.

$$L_{STOP} = 0.9094 E_{AVG}^{0.4522} \cdot P^{-1} \cdot T \quad \text{Equation 3}$$

The temperature T of the gas inside the first partition wall 37 is in the range of 273 K to 343 K. When the temperature T in Equation 3 is, for example, 300 K, the stop distance $L_{STOP}$ can be expressed by following Equation 4.

$$L_{STOP} = 272.8 \cdot E_{AVG}^{0.4522} \cdot P^{-1} \quad \text{Equation 4}$$

Figure 6:
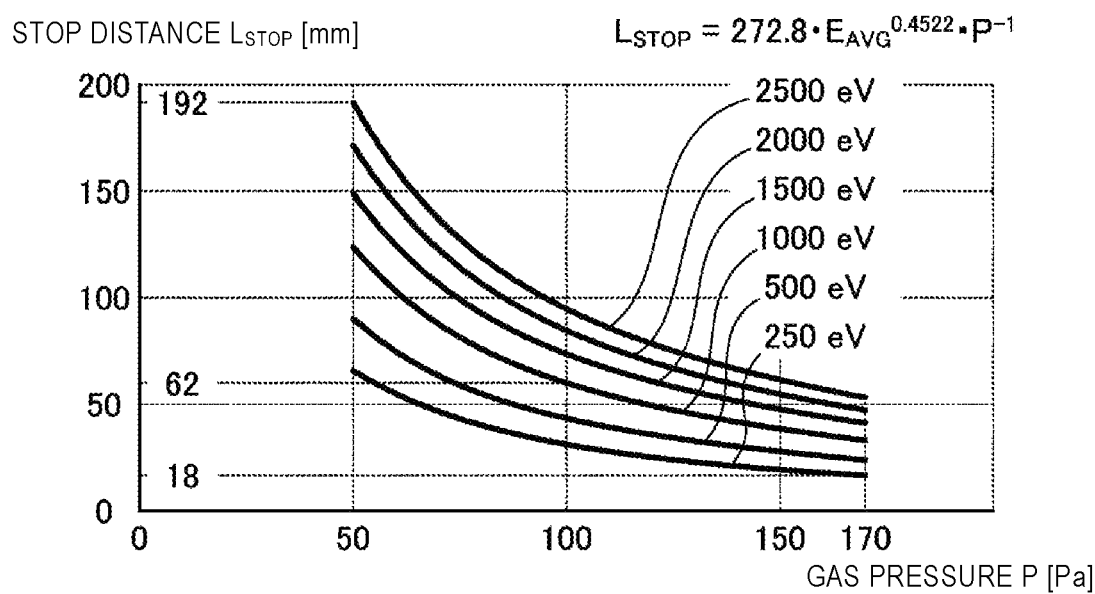
FIG. 6 is a graph showing the relationship between a gas pressure and a stop distance.

FIG. 6 is a graph showing the relationship between the gas pressure P and the stop distance $L_{STOP}$. The graph is based on Equation 4. Here, the gas pressure P is not less than 50 Pa and not more than 170 Pa, and cases of the average kinetic energy $E_{AVG}$ having values of 250 eV, 500 eV, 1000 eV, 1500 eV, 2000 eV, and 2500 eV are shown.

The average kinetic energy $E_{AVG}$ is preferably not less than 250 eV and not more than 2500 eV. Defining the stop distance $L_{STOP}$ when the average kinetic energy $E_{AVG}$ is, for example, 1000 eV in Equation 4 as $L_{STOP2}$, the stop distance $L_{STOP2}$ can be expressed by following Equation 5.

$$L_{STOP2} = 6201 \cdot P^{-1} \quad \text{Equation 5}$$

The gas pressure P is preferably not less than 50 Pa and not more than 170 Pa. When the gas pressure P in Equation 5 is, for example, 100 Pa, the stop distance $L_{STOP2}$ is calculated to be 62 mm. That is, at a position away from the center of the plasma generation region 25 by 62 mm, the kinetic energy of tin ions is substantially equal to the kinetic energy of the gas particles. Therefore, by setting the distance between the center of the plasma generation region 25 and the edge of the at least one opening to be equal to or more than 62 mm, tin ions are suppressed from jumping out to the outside of the first partition wall 37. That is, even if tin ions reach the vicinity of at least one opening, the tin ions are discharged to the outside of the chamber 2b by the gas flow.

From FIG. 6, the stop distance $L_{STOP}$ is not less than 18 mm and not more than 192 mm. The average kinetic energy $E_{AVG}$ and the gas pressure P preferably have values such that the stop distance $L_{STOP}$ is not less than 18 mm and not more than 192 mm, and more preferably have values such that the stop distance $L_{STOP}$ is not less than 40 mm and not more than 80 mm.

The plasma generation region 25 is located inside the first partition wall 37, and the EUV light concentrating mirror 23b is located outside the first partition wall 37. Therefore, the distance from the center of the plasma generation region 25 to the edge of the closest opening is less than the distance between the center of the plasma generation region 25 and the EUV light concentrating mirror 23b. Any of distances between the center of the plasma generation region 25 and the edges of the first to seventh openings 371 to 377 may be less than the distance between the center of the plasma generation region 25 and the EUV light concentrating mirror 23b.

Figure 7:
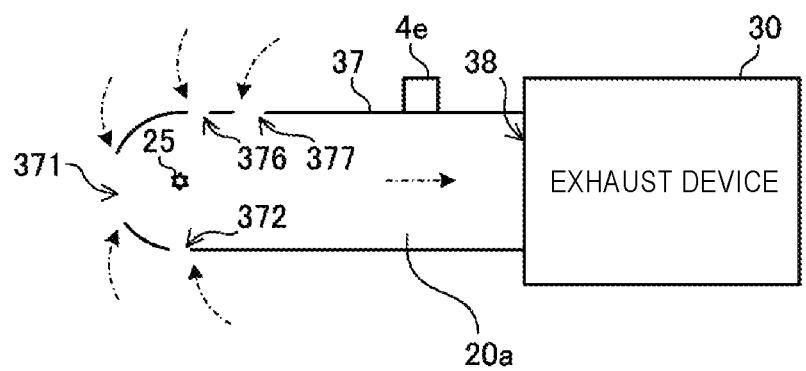
FIG. 7 is a sectional view showing arrangement of a pressure gauge on a first partition wall in the first embodiment.

FIG. 7 is a sectional view showing arrangement of a pressure gauge 4e on the first partition wall 37 in the first embodiment. In FIG. 7, the chamber 2b, the EUV light concentrating mirror 23b, and the like are omitted. The pressure gauge 4e may be a diaphragm vacuum gauge or a Pirani vacuum gauge capable of measuring low vacuum or medium vacuum. For example, the diaphragm vacuum gauge may be a ceramic capacitance manometer manufactured by ULVAC, Inc. located in Kanagawa Prefecture, Japan. It is possible to measure the gas pressure P inside the first partition wall 37 by the pressure gauge 4e as described above.

Here, the EUV light generation apparatus 1b may not include the pressure gauge 4e. The operation of the exhaust device 30 and the gas supply source 40 may be set so that the gas pressure P inside the first partition wall 37 becomes a desired value.

Figure 8:
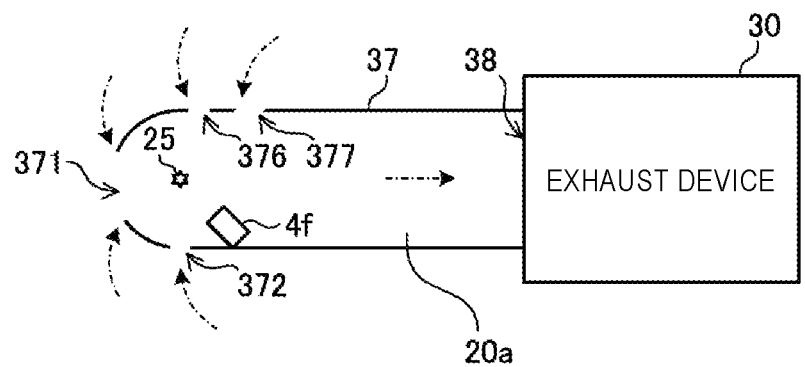
FIG. 8 is a sectional view showing arrangement of an ion energy measurement instrument on the first partition wall in the first embodiment.

FIG. 8 is a sectional view showing arrangement of an ion energy measurement instrument 4f on the first partition wall 37 in the first embodiment. In FIG. 8, the chamber 2b, the EUV light concentrating mirror 23b, and the like are omitted. The ion energy measurement instrument 4f may include a Faraday cup disposed at a position 100 mm from the center of the plasma generation region 25.

The average kinetic energy $E_{AVG}$ of ions can be measured by the ion energy measurement instrument 4f described above.

The procedure for measuring the average kinetic energy $E_{AVG}$ of ions is as follows. In a state where the supply of gas from the gas supply source 40 (see FIG. 2) is stopped and the gas pressure P inside the first partition wall 37 is $10^{-2}$ Pa or less, the target 27 is irradiated with the pulse laser light 33 having a desired wavelength and irradiation intensity $I_{LASER}$. The energy of ions emitted from the generated plasma is measured by a Faraday cup. By decreasing the gas pressure P in this manner, even when the energy of ions is measured at a position 100 mm from the center of the plasma generation region 25, the energy of ions can be measured in a state in which the influence of collision with gas particles is small. The irradiation intensity $I_{LASER}$ will be described later in a second embodiment.

The measurement of the energy of ions by a Faraday cup is described in the following literature.

A. Lorusso, F. Belloni, D. Doria, V. N sisi, WDS' 06 Proceedings of Contributed Papers, Part II, 75-80, 2006

Here, the EUV light generation apparatus 1b may not include the ion energy measurement instrument 4f. The irradiation intensity $I_{LASER}$ may be set so that the average kinetic energy $E_{AVG}$ of ions has a desired value.

3.4 Effect

According to the first embodiment, the EUV light generation apparatus 1b includes the chamber 2b, the first partition wall 37, the EUV light concentrating mirror 23b, the first gas supply port 51, and the gas exhaust port 38. The first partition wall 37 includes the first to seventh openings 371 to 377 that provide communication between the first space 20a in the chamber 2b and inside the first partition wall 37 and the second space 20b in the chamber 2b and outside the first partition wall 37. The EUV light concentrating mirror 23b is located in the second space 20b and concentrates EUV light generated in the plasma generation region 25 located in the first space 20a. The first gas supply port 51 is formed at the chamber 2b and supplies gas to the second space 20b. The gas exhaust port 38 is formed in the first partition wall 37 and exhausts the gas in the first space 20a to the space outside the first partition wall 37 and outside the chamber 2b. The average kinetic energy of ions generated in the plasma generation region 25 is represented by $E_{AVG}$ [eV], and the gas pressure inside the first partition wall 37 is represented by P [Pa]. The distances between the center of the plasma generation region 25 and the edges of the first to seventh openings 371 to 377 are equal to or more than the stop distance $L_{STOP}$ [mm] calculated by the following equation.

$$L_{STOP}=272.8 \cdot E_{AVG}^{0.4522} \cdot P^{-1}$$

Accordingly, by the time when the ions reach any one of the first to seventh openings 371 to 377, the kinetic energy of the ions becomes substantially the same as the kinetic energy of the gas particles around the ions. Accordingly, the ions are suppressed from jumping out from the first space 20a to the second space 20b, and the ions can be discharged to the outside of the chamber 2b by the gas flow. Therefore, deposition of debris to the EUV light concentrating mirror 23b is suppressed. In addition, since the density of tin in the second space 20b can be kept low, the loss of EUV light in the second space 20b is suppressed. Further, by setting the distance from the center of the plasma generation region 25 to the first partition wall 37 to the stop distance $L_{STOP}$ or more, it is possible to reduce damage to the first partition wall 37 due to high-speed ions.

In other respects, the first embodiment is similar to the comparative example.

4. EUV Light Generation System 11 Including Infrared Laser 4.1 Configuration and Operation In the second embodiment, the laser system 3 includes a $CO_2$ laser or an yttrium aluminum garnet (YAG) laser. The $CO_2$ laser outputs the pulse laser light 33 having a wavelength of about 10600 nm, and the YAG laser outputs the pulse laser light 33 having a wavelength of about 1064 nm. The average kinetic energy $E_{AVG}$ of tin ions is determined by the wavelength and the irradiation intensity $I_{LASER}$ of the pulse laser light 33.

The irradiation intensity $I_{LASER}$ is calculated by the following equation.

$$I_{LASER}=E_{LASER}/(\tau_{LASER} \cdot \pi \cdot (D_{SPOT}/2)^2)$$

Here, $E_{LASER}$ represents the pulse energy of the pulse laser light 33, and the unit is J. $\tau_{LASER}$ represents the pulse duration by full width at half maximum of the pulse laser light 33, and the unit is s. π represents the circular constant. $D_{SPOT}$ represents the spot diameter of a part having a light intensity of $1/e^2$ or more of the peak intensity at the concentration position of the pulse laser light 33, and the unit is cm. Note that e is the Napier's constant.

Figure 9:
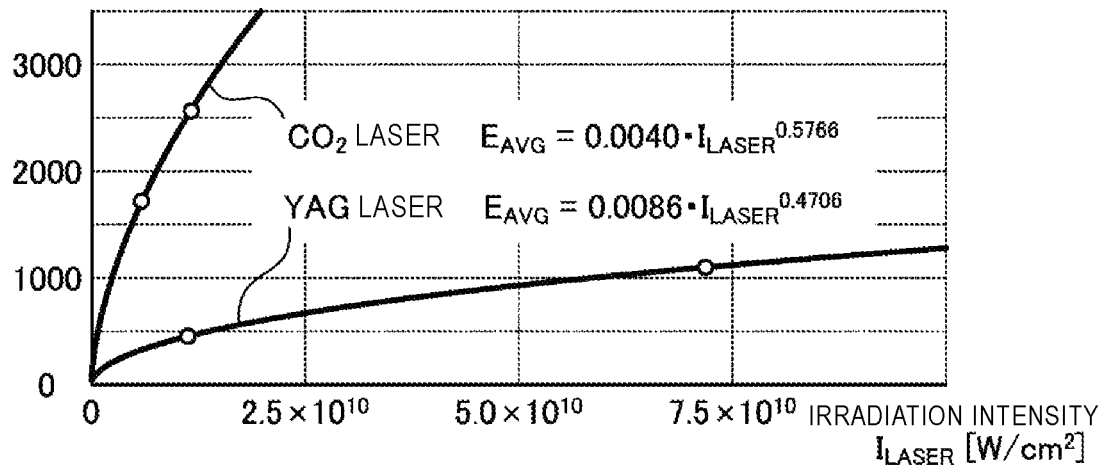
FIG. 9 is a graph showing the measurement result of the relationship between laser irradiation intensity of pulse laser light by a $CO_2$ laser and a YAG laser and the average kinetic energy of tin ions generated in the plasma generation region.

FIG. 9 is a graph showing the measurement result of the relationship between the laser irradiation intensity $I_{LASER}$ of the pulse laser light 33 by the $CO_2$ laser and the YAG laser and the average kinetic energy $E_{AVG}$ of tin ions generated in the plasma generation region 25. The relationship between the irradiation intensity $I_{LASER}$ and the average kinetic energy $E_{AVG}$ differs between the case where the laser system 3 includes a $CO_2$ laser and the case where the laser system 3 includes a YAG laser. When the laser system 3 includes a $CO_2$ laser, the approximate equation of the relationship between the irradiation intensity $I_{LASER}$ and the average kinetic energy $E_{AVG}$ is as shown in following Equation 6.

$$E_{AVG}=0.0040 \cdot I_{LASER}^{0.5766} \quad \text{Equation 6}$$

When the laser system 3 includes a YAG laser, the approximate equation of the relationship between the irradiation intensity $I_{LASER}$ and the average kinetic energy $E_{AVG}$ is as shown in following Equation 7.

$$E_{AVG}=0.0086 \cdot I_{LASER}^{0.4706} \quad \text{Equation 7}$$

4.2 in a Case of $CO_2$ Laser

Defining the stop distance $L_{STOP}$ when the laser system 3 includes a $CO_2$ laser as $L_{STOP3}$, from Equation 2 and Equation 6, the stop distance $L_{STOP3}$ can be expressed by following Equation 8.

$$L_{STOP3}=0.07489 \cdot I_{LASER}^{0.2607} \cdot P^{-1} \cdot T \quad \text{Equation 8}$$

The temperature T of the gas inside the first partition wall 37 is in the range of 273 K to 343 K. When the temperature T in Equation 8 is, for example, 300 K, the stop distance $L_{STOP3}$ can be expressed by following Equation 9.

$$L_{STOP3} = 22.467 \cdot I_{LASER}^{0.2607} \cdot P^{-1} \quad \text{Equation 9}$$

Figure 10:
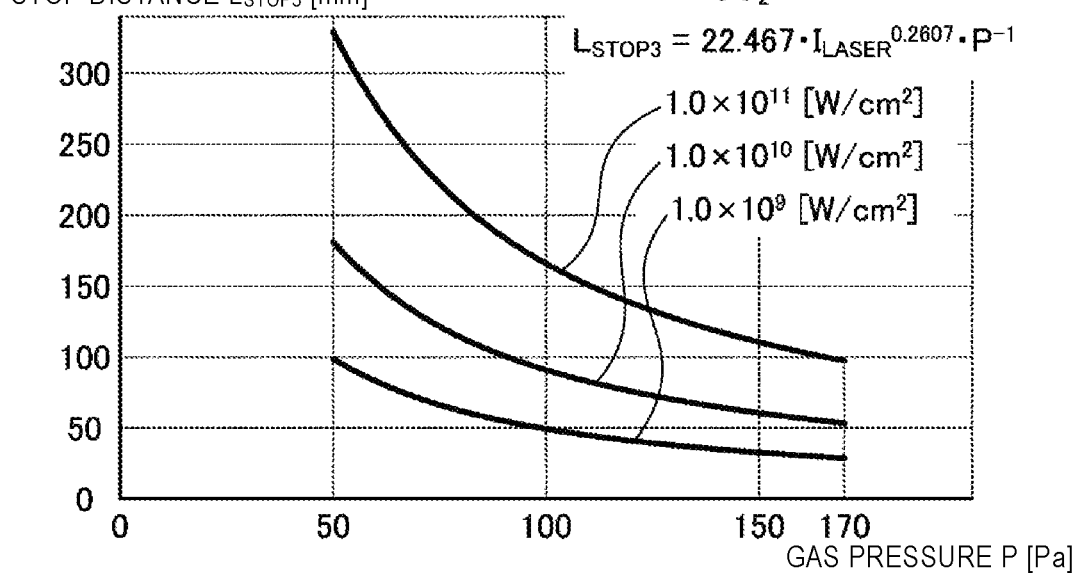
FIG. 10 is a graph showing the relationship between the gas pressure and the stop distance when a laser system includes a $CO_2$ laser.

FIG. 10 is a graph showing the relationship between the gas pressure P and the stop distance $L_{STOP3}$ when the laser system 3 includes a $CO_2$ laser. The graph is based on Equation 9. Here, the gas pressure P is not less than 50 Pa and not more than 170 Pa and cases of the irradiation intensity $I_{LASER}$ having values of $1.0 \times 10^9$ W/cm$^2$, $1.0 \times 10^{10}$ W/cm$^2$, and $1.0 \times 10^{11}$ W/cm$^2$ are illustrated.

The irradiation intensity $I_{LASER}$ is preferably not less than $1.0 \times 10^9$ W/cm$^2$ and not more than $1.0 \times 10^{11}$ W/cm$^2$. When the irradiation intensity $I_{LASER}$ in Equation 9 is, for example, $1.0 \times 10^{10}$ W/cm$^2$, the stop distance $L_{STOP3}$ can be expressed by following Equation 10.

$$L_{STOP3} = 9090 \cdot P^{-1} \quad \text{Equation 10}$$

The gas pressure P is preferably not less than 50 Pa and not more than 170 Pa.

4.3 in a Case of YAG Laser

Defining the stop distance $L_{STOP}$ when the laser system 3 includes a YAG laser as $L_{STOP4}$, from Equation 2 and Equation 7, the stop distance $L_{STOP4}$ can be expressed by following Equation 11.

$$L_{STOP4} = 0.10586 \cdot I_{LASER}^{0.2128} \cdot P^{-1} \cdot T \quad \text{Equation 11}$$

The temperature T of the gas inside the first partition wall 37 is in the range of 273 K to 343 K. When the temperature T in Equation 11 is, for example, 300 K, the stop distance $L_{STOP4}$ can be expressed by following Equation 12.

$$L_{STOP4} = 31.758 \cdot I_{LASER}^{0.2128} \cdot P^{-1} \quad \text{Equation 12}$$

Figure 11:
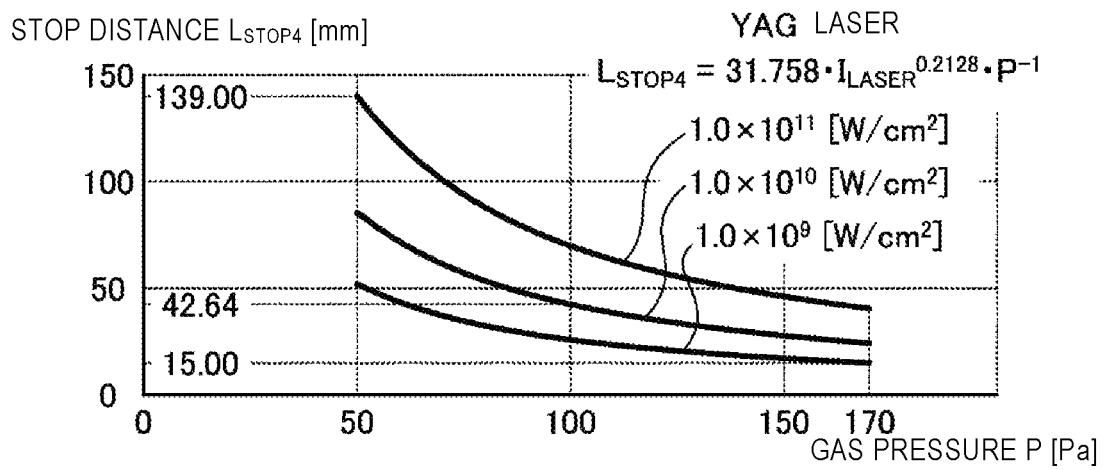
FIG. 11 is a graph showing the relationship between the gas pressure and the stop distance when the laser system includes a YAG laser.

FIG. 11 is a graph showing the relationship between the gas pressure P and the stop distance $L_{STOP4}$ when the laser system 3 includes a YAG laser. The graph is based on Equation 12. Here, the gas pressure P is not less than 50 Pa and not more than 170 Pa and each case of the irradiation intensity $I_{LASER}$ having values of $1.0 \times 10^9$ W/cm$^2$, $1.0 \times 10^{10}$ W/cm$^2$, and $1.0 \times 10^{11}$ W/cm$^2$ are illustrated.

The irradiation intensity $I_{LASER}$ is preferably not less than $1.0 \times 10^9$ W/cm$^2$ and not more than $1.0 \times 10^{11}$ W/cm$^2$. When the irradiation intensity $I_{LASER}$ in Equation 12 is, for example, $1.0 \times 10^{10}$ W/cm$^2$, the stop distance $L_{STOP4}$ can be expressed by following Equation 13.

$$L_{STOP4} = 4264 \cdot P^{-1} \quad \text{Equation 13}$$

The gas pressure P is preferably not less than 50 Pa and not more than 170 Pa. When the gas pressure P in Equation 13 is, for example, 100 Pa, the stop distance $L_{STOP4}$ is calculated to be 42.64 mm. Therefore, by setting the distance between the center of the plasma generation region 25 and the edge of the at least one opening to be equal to or more than 42.64 mm, tin ions are suppressed from jumping out to the outside of the first partition wall 37.

From FIG. 11, the stop distance $L_{STOP4}$ is not less than 15 mm and not more than 139 mm. The average kinetic energy $E_{AVG}$ and the gas pressure P preferably have values such that the stop distance $L_{STOP4}$ is not less than 15 mm and not more than 139 mm, and more preferably have values such that the stop distance $L_{STOP4}$ is not less than 40 mm and not more than 80 mm.

4.4 Effect

According to the second embodiment, the distance between the center of the plasma generation region 25 and the edge of at least one opening can be set to an appropriate value in accordance with the wavelength of the pulse laser light 33, the irradiation intensity $I_{LASER}$, and the gas pressure P inside the first partition wall 37.

In other respects, the second embodiment is similar to the first embodiment.

Figure 12:
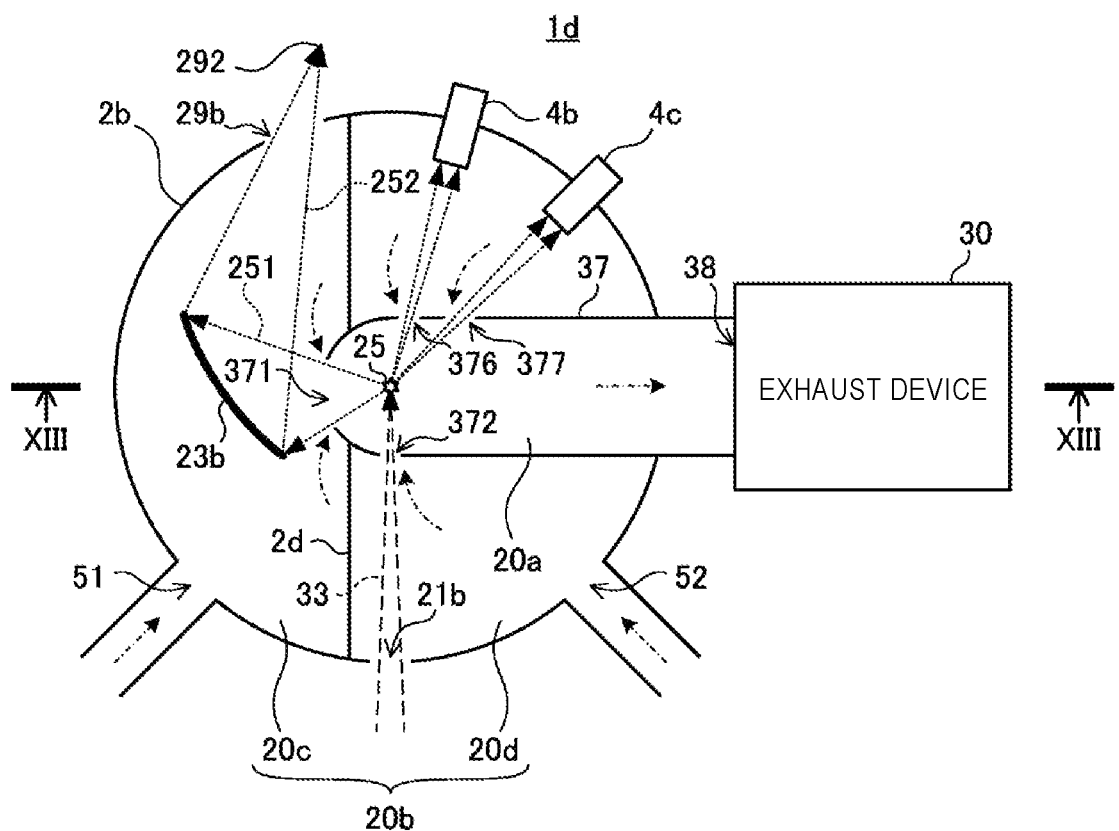
FIG. 12 is a sectional view showing the configuration of the EUV light generation apparatus according to a third embodiment.
Figure 13:
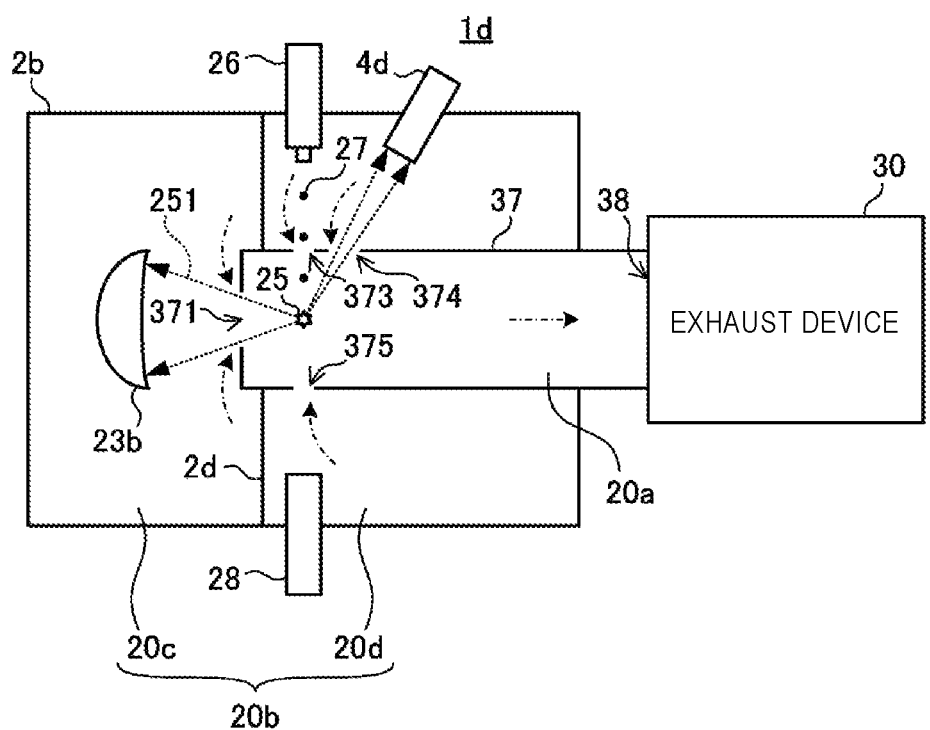
FIG. 13 is a sectional view showing the configuration of the EUV light generation apparatus according to the third embodiment.

5. EUV Light Generation Apparatus 1d Including Second Partition Wall 2d 5.1 Configuration FIGS. 12 and 13 are sectional views showing the configuration of an EUV light generation apparatus 1d according to a third embodiment. FIG. 12 shows a cross-section perpendicular to the trajectory of the target 27, and FIG. 13 shows a cross-section perpendicular to the optical path axis of the pulse laser light 33. FIG. 13 corresponds to a sectional view taken along line XIII-XIII of FIG. 12.

In addition to the components of the EUV light generation apparatus 1b, the EUV light generation apparatus 1d includes a second partition wall 2d and a second gas supply port 52.

The second partition wall 2d separates the second space 20b in the chamber 2b into a third space 20c and a fourth space 20d.

The first opening 371 is configured to provide communication between the third space 20c and the first space 20a.

The first opening 371 allows the EUV light to pass therethrough from the plasma generation region 25 in the first space 20a toward the EUV light concentrating mirror 23b located in the third space 20c.

The second to seventh openings 372 to 377 are configured to provide communication between the fourth space 20d and the first space 20a. The second opening 372 allows the pulse laser light 33 to pass therethrough from the fourth space 20d toward the plasma generation region 25 located in the first space 20a.

5.2 Operation

The gas supply source 40 (see FIG. 2) supplies gas to the third space 20c through the first gas supply port 51. The gas supply source 40 supplies gas to the fourth space 20d through the second gas supply port 52. The flow rate of the gas supplied through the first gas supply port 51 and the flow rate of the gas supplied through the second gas supply port 52 are individually controlled by a control unit such as the processor 5.

The gas supplied to the third space 20c fills the third space 20c, and then flows into the first space 20a through the first opening 371.

The gas supplied to the fourth space 20d fills the fourth space 20d, and then flows into the first space 20a through the second to seventh openings 372 to 377.

5.3 Effect

For example, in the case where a plurality of openings including the first and second openings 371 and 372 are formed inside the first partition wall 37 as in the first embodiment, if the pressure difference between the inside and the outside of the first partition wall 37 in the vicinity of the first opening 371 is substantially the same as that in the vicinity of the second opening 372, the flow velocity of the gas at the first opening 371 may not be the same as that at the second opening 372. For example, when the area of the second opening 372 is smaller than that of the first opening 371, it is considered that the flow velocity of the gas at the second opening 372 is lower than that at the first opening 371. In this case, there is a possibility that ions of the target substance leak out in the direction opposite to the gas flow in the second opening 372. In order to increase the flow velocity of the gas in the second opening 372, it may be required to supply a large amount of the gas to the second space 20*b*.

According to the third embodiment, the EUV light generation apparatus 1*d* further includes the second partition wall 2*d* that separates the second space 20*b* into the third space 20*c* and the fourth space 20*d*, and the second gas supply port 52 that is formed at the chamber 2*b* and supplies the gas to the fourth space 20*d*. The first gas supply port 51 is configured to supply the gas to the third space 20*c*. The first partition wall 37 has the first and second openings 371 and 372. The first opening 371 provides communication between the third space 20*c* and the first space 20*a*, and the second opening 372 provides communication between the fourth space 20*d* and the first space 20*a*.

As described above, in the third embodiment, the third space 20*c* communicating with the first space 20*a* through the first opening 371 and the fourth space 20*d* communicating with the first space 20*a* through the second opening 372 are separated by the second partition wall 2*d*. Then, the gas is individually supplied to the third space 20*c* and the fourth space 20*d*. Accordingly, the gas amounts supplied from the first and second gas supply ports 51 and 52 can be individually controlled so that movement of ions of the target substance in the direction opposite to the gas flow is suppressed in each of the first opening 371 and the second opening 372. Therefore, the gas consumption amount can be reduced.

According to the third embodiment, the first opening 371 allows the EUV light to pass therethrough from the plasma generation region 25 toward the EUV light concentrating mirror 23*b*, and the second opening 372 allows the pulse laser light 33 to pass therethrough from the fourth space 20*d* toward the plasma generation region 25.

The area of the second opening 372 through which the pulse laser light 33 passes is smaller than the area of the first opening 371. By individually controlling the gas supply amounts from the first and second gas supply ports 51 and 52 so as to suppress the movement of ions of the target substance, the gas consumption amount can be reduced.

According to the third embodiment, the EUV light generation apparatus 1*d* includes the target supply unit 26 that supplies the target 27 to the plasma generation region 25. The first partition wall 37 has the third opening 373, and the third opening 373 provides communication between the fourth space 20*d* and the first space 20*a* and allows the target 27 to pass therethrough.

The area of the third opening 373 through which the target 27 passes is smaller than the area of the first opening 371. By individually controlling the gas supply amounts from the first and second gas supply ports 51 and 52 so as to suppress the movement of ions of the target substance, the gas consumption amount can be reduced.

According to the third embodiment, the first partition wall 37 has the fourth, sixth, and seventh openings 374, 376, and 377 configured to provide communication between the fourth space 20*d* and the first space 20*a* and allow light for observing a part of the first space 20*a* to pass therethrough.

Each area of the fourth, sixth, and seventh openings 374, 376, and 377 through which the light for observing a part of the first space 20*a* passes is smaller than the area of the first opening 371. By individually controlling the gas supply amounts from the first and second gas supply ports 51 and 52 so as to suppress the movement of debris of the target substance, the gas consumption amount can be reduced.

In other respects, the third embodiment is similar to the first embodiment. Alternatively, as in the second embodiment, the laser system 3 may include an infrared laser.

6. Others

Figure 14:
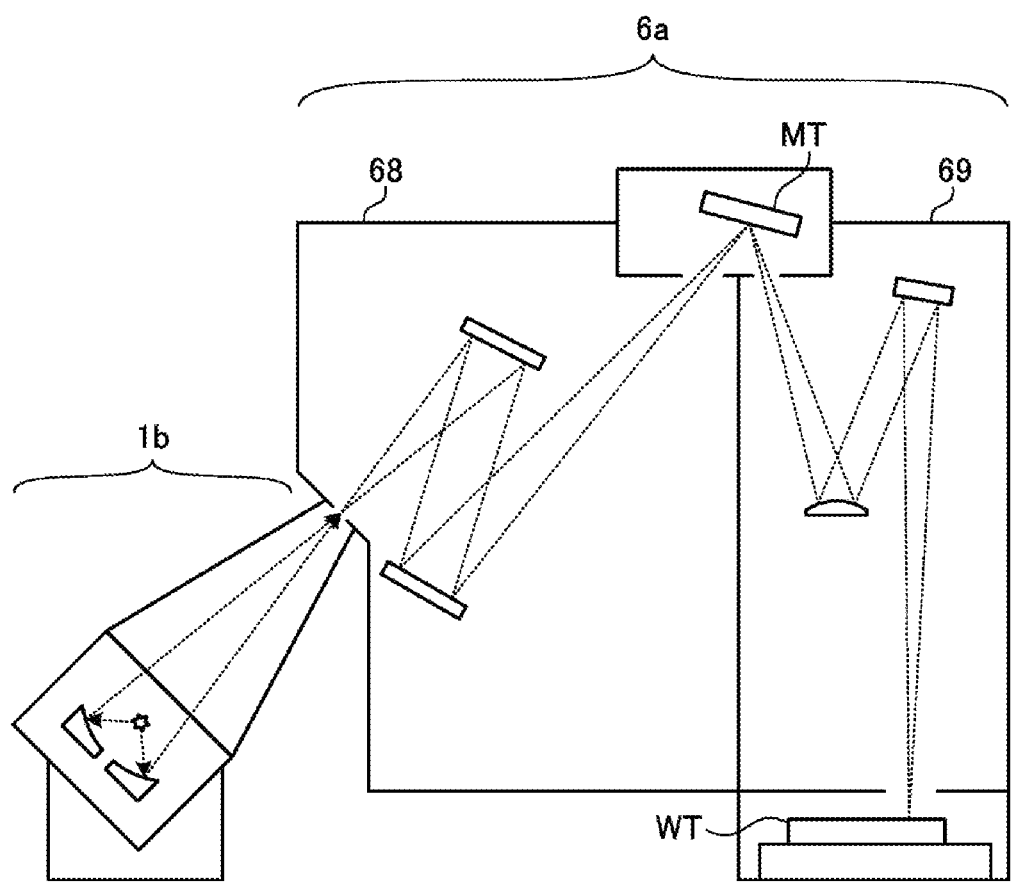
FIG. 14 schematically shows the configuration of an exposure apparatus connected to the EUV light generation apparatus.

FIG. 14 schematically shows the configuration of an exposure apparatus 6*a* connected to the EUV light generation apparatus 1*b*.

In FIG. 14, the exposure apparatus 6*a* as the external apparatus 6 (see FIG. 1) includes a mask irradiation unit 68 and a workpiece irradiation unit 69. The mask irradiation unit 68 illuminates, via a reflection optical system, a mask pattern of the mask table MT with the EUV light incident from the EUV light generation apparatus 1*b*. The workpiece irradiation unit 69 images the EUV light reflected by the mask table MT onto a workpiece (not shown) arranged on a workpiece table WT via the reflection optical system. The workpiece is a photosensitive substrate such as a semiconductor wafer on which photoresist is applied. The exposure apparatus 6*a* synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured. Instead of the EUV light generation apparatus 1*b*, the EUV light generation apparatus 1*d* may be used.

Figure 15:
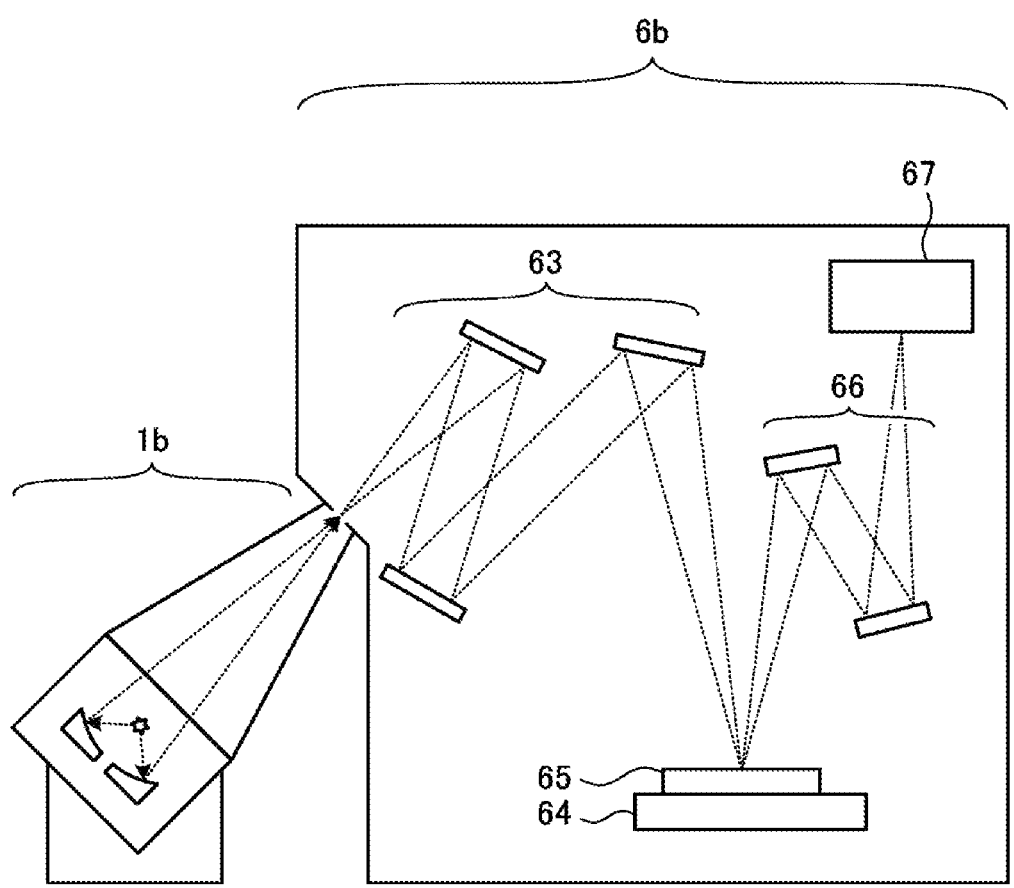
FIG. 15 schematically shows the configuration of an inspection device connected to the EUV light generation apparatus.

FIG. 15 schematically shows the configuration of an inspection device 6*b* connected to the EUV light generation apparatus 1*b*.

In FIG. 15, the inspection device 6*b* as the external apparatus 6 (see FIG. 1) includes an illumination optical system 63 and a detection optical system 66. The illumination optical system 63 reflects the EUV light incident from the EUV light generation apparatus 1*b* to illuminate the mask 65 placed on a mask stage 64. Here, the mask 65 conceptually includes a mask blanks before a pattern is formed. The detection optical system 66 reflects the EUV light from the illuminated mask 65 and forms an image on a light receiving surface of a detector 67. The detector 67 having received the EUV light obtains an image of the mask 65. The detector 67 is, for example, a time delay integration (TDI) camera. Defects of the mask 65 are inspected based on the image of the mask 65 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6*a*. Instead of the EUV light generation apparatus 1*b*, the EUV light generation apparatus 1*d* may be used.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. An extreme ultraviolet light generation system, comprising:
   a chamber;
   a first partition wall having at least one opening which provides communication between a first space in the chamber and inside the first partition wall and a second space in the chamber and outside the first partition wall;
   an EUV light concentrating mirror located in the second space and configured to concentrate extreme ultraviolet light generated in a plasma generation region located in the first space;
   a first gas supply port formed at the chamber and configured to supply gas to the second space; and
   a gas exhaust port formed in the first partition wall and configured to exhaust gas in the first space to outside the first partition wall and outside the chamber,
   a distance between the center of the plasma generation region and an edge of the at least one opening being equal to or more than a stop distance $L_{STOP}$ [mm] calculated by the following equation, $$L_{STOP} = 272.8 \cdot E_{AVG}^{0.4522} \cdot P^{-1}$$

$E_{AVG}$ [eV] representing average kinetic energy of ions generated in the plasma generation region and P [Pa] representing a gas pressure inside the first partition wall 2. The extreme ultraviolet light generation system according to claim 1,
   wherein the average kinetic energy $E_{AVG}$ is not less than 250 eV and not more than 2500 eV.

3. The extreme ultraviolet light generation system according to claim 1,
   wherein the distance is equal to or more than a stop distance $L_{STOP2}$ [mm] calculated by the following equation, $$L_{STOP2} = 6201 \cdot P^{-1}$$

4. The extreme ultraviolet light generation system according to claim 1,
   wherein the gas pressure P is not less than 50 Pa and not more than 170 Pa.

5. The extreme ultraviolet light generation system according to claim 1,
   wherein the distance is equal to more than 62 mm.

6. The extreme ultraviolet light generation system according to claim 1,
   wherein the average kinetic energy $E_{AVG}$ and the gas pressure P has a value such that the stop distance $L_{STOP}$ is not less than 18 mm and not more than 192 mm.

7. The extreme ultraviolet light generation system according to claim 1,
   wherein the average kinetic energy $E_{AVG}$ and the gas pressure P each have values such that the stop distance $L_{STOP}$ is not less than 40 mm and not more than 80 mm.

8. The extreme ultraviolet light generation system according to claim 1,
   wherein the at least one opening includes a plurality of openings, and
   any of distances between the center of the plasma generation region and edges of the plurality of openings may be less than a distance between the center of the plasma generation region and the EUV light concentrating mirror.

9. The extreme ultraviolet light generation system according to claim 1, further comprising:
   a target supply unit configured to supply a target substance to the plasma generation region; and
   a $CO_2$ laser configured to emit pulse laser light to be radiated to the target substance,
   wherein the distance is equal to or more than a stop distance $L_{STOP3}$ [mm] calculated by the following equation, $$L_{STOP3} = 22.467 \cdot I_{LASER}^{0.2607} \cdot P^{-1}$$

$I_{LASER}$ [W/cm$^2$] representing irradiation intensity of the pulse laser light in the plasma generation region 10. The extreme ultraviolet light generation system according to claim 9,
    wherein the irradiation intensity $I_{LASER}$ is not less than $1.0 \times 10^9$ W/cm$^2$ and not more than $1.0 \times 10^{11}$ W/cm$^2$.

11. The extreme ultraviolet light generation system according to claim 1, further comprising:
    a target supply unit configured to supply a target substance to the plasma generation region; and
    a $CO_2$ laser configured to emit pulse laser light to be radiated to the target substance,
    wherein the distance is equal to or more than a stop distance $L_{STOP3}$ [mm] calculated by the following equation, $$L_{STOP3} = 9090 \cdot P^{-1}$$

12. The extreme ultraviolet light generation system according to claim 1, further comprising:
    a target supply unit configured to supply a target substance to the plasma generation region; and
    a YAG laser configured to emit pulse laser light to be radiated to the target substance,
    wherein the distance is equal to or more than a stop distance $L_{STOP4}$ [mm] calculated by the following equation, $$L_{STOP4} = 31.758 \cdot I_{LASER}^{0.2128} \cdot P^{-1}$$

$I_{LASER}$ [W/cm$^2$] representing irradiation intensity of the pulse laser light in the plasma generation region 13. The extreme ultraviolet light generation system according to claim 12,
    wherein the irradiation intensity $I_{LASER}$ is not less than $1.0 \times 10^9$ W/cm$^2$ and not more than $1.0 \times 10^{11}$ W/cm$^2$.

14. The extreme ultraviolet light generation system according to claim 1, further comprising:
    a target supply unit configured to supply a target substance to the plasma generation region; and
    a YAG laser configured to emit pulse laser light to be radiated to the target substance,
    wherein the distance is equal to or more than a stop distance $L_{STOP4}$ [mm] calculated by the following equation, $$L_{STOP4} = 4264 \cdot P^{-1}$$

15. The extreme ultraviolet light generation system according to claim 1, further comprising:
    a target supply unit configured to supply a target substance to the plasma generation region; and
    a YAG laser configured to emit pulse laser light to be radiated to the target substance,
    wherein the distance is equal to or more than 42.64 mm.

16. The extreme ultraviolet light generation system according to claim 1, further comprising:
    a target supply unit configured to supply a target substance to the plasma generation region; and a YAG laser configured to emit pulse laser light to be radiated to the target substance, wherein the average kinetic energy $E_{AVG}$ and the gas pressure P each have values such that the stop distance $L_{STOP}$ is not less than 15 mm and not more than 139 mm.

17. The extreme ultraviolet light generation system according to claim 1, further comprising:

a second partition wall that separates the second space into a third space and a fourth space; and a second gas supply port formed at the chamber and configured to supply gas to the fourth space, wherein the first gas supply port supplies gas to the third space, the at least one opening includes a first opening and a second opening, the first opening provides communication between the third space and the first space, and the second opening provides communication between the fourth space and the first space.

18. The extreme ultraviolet light generation system according to claim 17, wherein the first opening allows the extreme ultraviolet light to pass therethrough from the plasma generation region toward the EUV light concentrating mirror, and the second opening allows pulse laser light to pass therethrough from the fourth space toward the plasma generation region.

19. An electronic device manufacturing method, comprising:

generating extreme ultraviolet light in an extreme ultraviolet light generation system;

emitting the extreme ultraviolet light to an exposure apparatus; and exposing a photosensitive substrate to the extreme ultraviolet light in the exposure apparatus to manufacture an electronic device, the extreme ultraviolet light generation system including a chamber;

a first partition wall having at least one opening which provides communication between a first space in the chamber and inside the first partition wall and a second space in the chamber and outside the first partition wall;

an EUV light concentrating mirror located in the second space and configured to concentrate the extreme ultraviolet light generated in a plasma generation region located in the first space;

a first gas supply port formed at the chamber and configured to supply gas to the second space; and a gas exhaust port formed in the first partition wall and configured to exhaust gas in the first space to a space outside the first partition wall and outside the chamber, a distance between the center of the plasma generation region and an edge of the at least one opening being equal to or more than a stop distance $L_{STOP}$ [mm] calculated by the following equation, $$L_{STOP}=272.8 \cdot E_{AVG}^{0.4522} \cdot P^{-1}$$

$E_{AVG}$ [eV] representing average kinetic energy of ions generated in the plasma generation region and P [Pa] representing a gas pressure inside the first partition wall 20. An electronic device manufacturing method, comprising:

inspecting a defect of a mask by irradiating the mask with extreme ultraviolet light generated by an extreme ultraviolet light generation system;

selecting a mask using a result of the inspection; and exposing and transferring a pattern formed on the selected mask onto a photosensitive substrate, the extreme ultraviolet light generation system including a chamber;

a first partition wall having at least one opening which provides communication between a first space in the chamber and inside the first partition wall and a second space in the chamber and outside the first partition wall;

an EUV light concentrating mirror located in the second space and configured to concentrate the extreme ultraviolet light generated in a plasma generation region located in the first space;

a first gas supply port formed in the chamber and configured to supply gas to the second space; and a gas exhaust port formed in the first partition wall and configured to exhaust gas in the first space to a space outside the first partition wall and outside the chamber, a distance between the center of the plasma generation region and an edge of the at least one opening being equal to or more than a stop distance $L_{STOP}$ [mm] calculated by the following equation, $$L_{STOP}=272.8 \cdot E_{AVG}^{0.4522} \cdot P^{-1}$$

$E_{AVG}$ [eV] representing average kinetic energy of ions generated in the plasma generation region and P [Pa] representing a gas pressure inside the first partition wall

* * * * *